United States Patent [19]

Mohuchy

[11] Patent Number: 4,864,315

[45] Date of Patent: Sep. 5, 1989

[54] PHASED ARRAY ANTENNA TESTING ARRANGEMENT

[75] Inventor: Wolodymyr Mohuchy, Nutley, N.J.

[73] Assignee: ITT Avionics, Nutley, N.J.

[21] Appl. No.: 102,076

[22] Filed: Sep. 29, 1987

Related U.S. Application Data

[63] Continuation-in-part of Ser. No. 795,060, Nov. 5, 1985, abandoned.

[51] Int. Cl.$^4$ ............................................. G01S 7/40
[52] U.S. Cl. ..................... 343/703; 342/173; 343/777
[58] Field of Search ............... 343/703, 776, 777, 786, 343/841; 324/58 R, 58 C; 342/169, 170, 173, 174, 351, 360, 372; 455/67

[56] References Cited

U.S. PATENT DOCUMENTS

| | | | |
|---|---|---|---|
| 3,199,107 | 8/1965 | Mills | 342/170 |
| 3,378,846 | 4/1968 | Lowenschuss | 342/170 |
| 3,560,976 | 2/1971 | Foldes | 343/786 |
| 3,604,000 | 9/1971 | Briana et al. | 342/173 |
| 4,521,780 | 6/1985 | Preikschat | 342/170 |

Primary Examiner—William L. Sikes
Assistant Examiner—Michael C. Wimer
Attorney, Agent, or Firm—Thomas N. Twomey; Mary C. Werner

[57] ABSTRACT

An arrangement for testing the performance of an electronic system utilizing a phased array antenna as its principal radiator into a predetermined sector of space includes, as one of its main components, an enclosure which bounds a miniature anechoic chamber located in the near-field region of the antenna array during the performance of a testing operation and lined with material that absorbs free space electromagnetic radiation. The enclosure has an opening that is aligned with the phased array antenna the performance of which is being tested. Two dual-polarized testing horn antennas are situated at a wall of the enclosure that is opposite to the wall provided with the opening. Electrical signals received from the horn antennas and representative of the near-field electromagnetic radiation emitted by the phased array antenna are supplied to an evaluating circuit which gives indication of the performance of the electronic system of the phased array antenna. A control circuit is employed for energizing the testing antennas in any desired manner to issue electromagnetic radiation toward the phased array antenna being tested. A polarimeter is used to accurately determine the polarization capabilities of the antenna over a wide bandwidth.

6 Claims, 2 Drawing Sheets

PHASED ARRAY ANTENNA TESTING ARRANGEMENT

This is a continuation-in-part of pending application Ser. No. 795,060 filed Nov. 5, 1985, now abandoned.

BACKGROUND OF INVENTION

The present invention relates generally to testing arrangements, and more particularly to an arrangement for testing phased array antennas which operate in both CW and pulsed modes over multioctave RF frequency range and require very accurate polarization set-on capabilities.

The government has rights in this invention pursuant to Contract No. F 33657-79-C-0083 awarded by the Department of the Air Force.

There are already known electronic systems which employ phased array antennas as their principal radiators into free space. Such phased array antennas include a plurality of antenna elements which are energized while operating in a transmitting mode with different waveforms, with the result that an electromagnetic radiation field develops in the so-called far field, that is, at a certain distance from the phased array antenna, which radiation field is confined to a predetermined spatial sector and scans such sector. Such phased array antenna is usually also used as a receiving antenna from the free space, especially from the aforementioned spatial sector, and the electromagnetic radiation received thereby is often utilized, after having been converted into electric signals representative thereof, for adapting the operation of the circuitry which controls the supply of the above-mentioned different waveforms to the phased array antenna. This is particularly useful in the electronic countermeasures field, where it is important that electromagnetic radiation emitted by the phased antenna array be correlated to electromagnetic radiation received from enemy sources, particularly the polarization of such electromagnetic radiation to be able to convey to the enemy false information about the location of the potential target equipped with the phased array antenna arrangement.

To assure that the phased array antenna arrangement performs in the desired manner, it is necessary to test the electromagnetic radiation pattern of the phased array antenna and the reaction of the phased array antenna arrangement to different types of received electromagnetic radiation at least after the arrangement has been manufactured and/or installed in the respective craft, but more often than not also from time to time or as required after the arrangement has been installed, to make sure that the arrangement still operates in the desired manner. The approach to such testing which is currently used the most is to employ a test enclosure, also called a test hat, which includes equipment capable of measuring or testing the performance of the phased antenna array in the far field, that is, at a region at which the electromagnetic radiation pattern emitted by the phased array antenna is already fully developed. This brings about the advantage that the radiation pattern at this far-field region is relatively simple, so that it is quite easy to process the electrical signals representative of this radiation pattern in the far-field region and detect the performance of the phased array antenna therefrom. However, because of the relatively large distance of the far-field from the phased array antenna, the test enclosure of this type has to have substantial dimensions, which renders its handling rather difficult, especially when used in support facilities that are not specially equipped for performing this task. On the other hand, it was heretofore believed by people active in the area of testing array antennas that it is necessary to perform the testing in the far field, especially since generic near-field solutions require measuring of both amplitude and phase and extensive computational processing, so that such testing arrangements would be costly and subject to serious errors due to tolerances and environment.

SUMMARY OF THE INVENTION

Accordingly, it is a general object of the present invention to avoid the limitations of the prior art which uses far-field techniques and does not provide the total range of polarization control (all polarizations) and the ratio of wanted to unwanted polarization. The prior art devices were limited to narrowband frequencies.

More particularly, it is an object of the present invention to provide an arrangement for testing the performance of an electronic equipment utilizing a phased array antenna, which arrangement does not possess the limitations of the known arrangements of this type.

Still another object of the present invention is so to construct the arrangement of the type here under consideration as to be able to test the performance of the electronic equipment in a relatively simple and easy manner.

It is yet another object of the present invention to so design the above-mentioned arrangement as to be able to test the performance of the phased array antenna equipment in the near-field thereof.

A concomitant object of the present invention is to develop a testing arrangement of the above type which is relatively simple in construction, inexpensive to manufacture, easy to install and handle, and reliable in operation nevertheless.

In pursuance of these objects and others which will become apparent hereafter, one feature of the present invention resides in an arrangement for testing the performance of an electronic system employing a phased array antenna with an aperture of predetermined dimensions for electromagnetic radiation scanning of a predetermined space sector, this arrangement comprising enclosure means for bounding an anechoic chamber having an opening that is in registry with the aperture of the phased array antenna during the performance of a testing operation; at least two testing antennas disposed in the chamber opposite the opening and within the near field of the phased array antenna at predetermined locations accommodated to the predetermined space sector and the phased array antenna bandwidth and operative for at least receiving electromagnetic radiation emitted by the phased array antenna into the chamber during the testing operation and converting such received electromagnetic radiation into corresponding electrical signals; and means for evaluating the electrical signals.

A particular advantage of the arrangement of the present invention as described above is that, since it is intended and able to measure the electromagnetic field emitted by the phased array antenna in the near-field region, the dimensions of the test enclosure are significantly, such as five to ten times, smaller than those of the known arrangements operating in the far-field region, so that the arrangement of the present invention is much easier to handle than such known arrangements. Yet, experience has shown that the results obtained by using the arrangement of the present invention are just as reliable as, if not more reliable than, those obtained from the known arrangements. Of particular significance is the polarization measurement capability over an extended frequency bandwidth and the operation of both pulsed and CW waveforms.

Above-mentioned and other features and objects of this invention will become more apparent by reference to the following description taken in conjunction with the accompanying drawings, in which.

DETAILED DESCRIPTION OF THE PREFERRED EMBODIMENT

Figure 1:
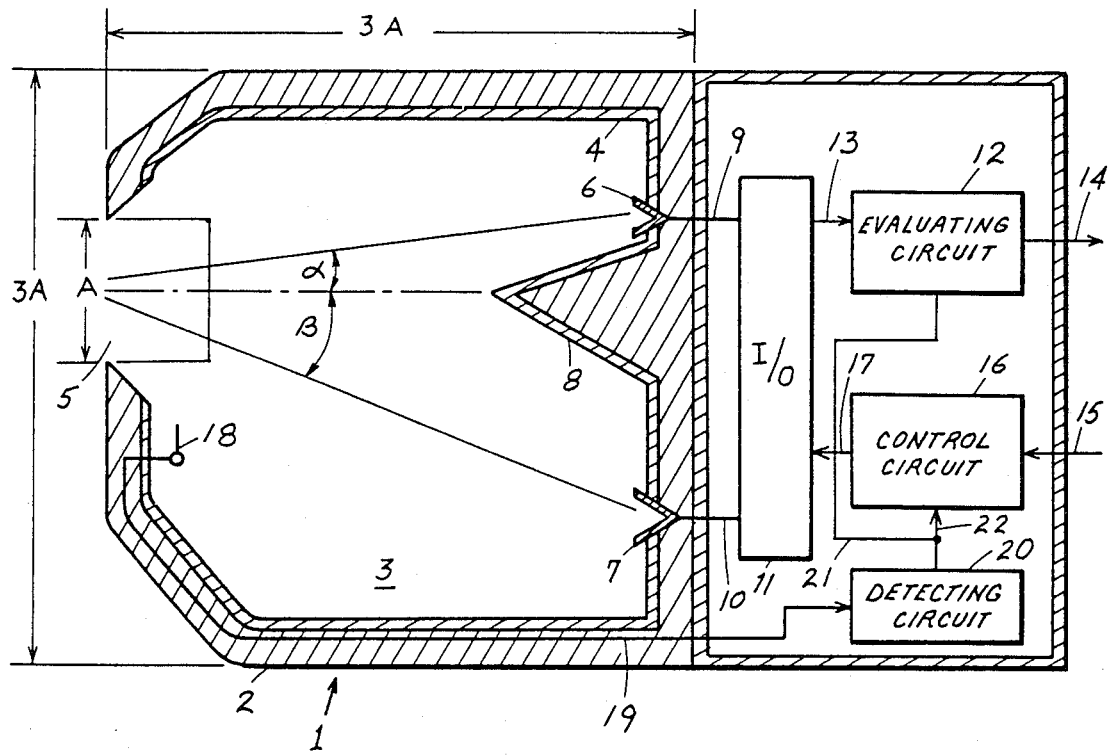
FIG. 1 is a partly diagrammatic sectioned top plan view of a testing arrangement according to the present invention.
Figure 2:
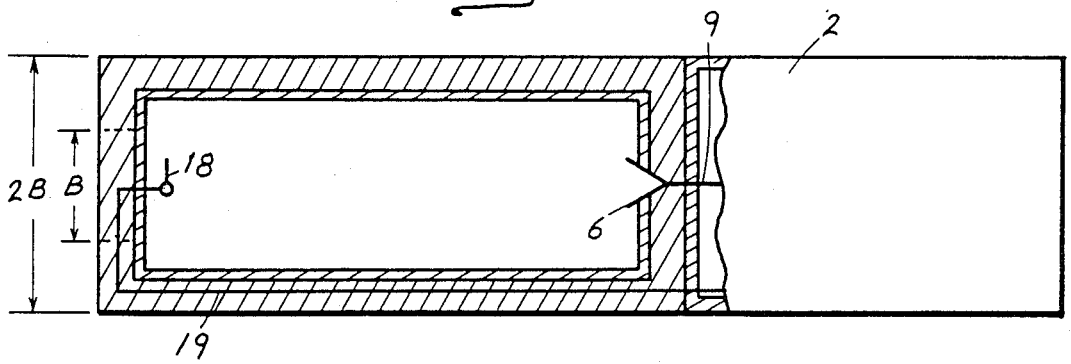
FIG. 2 is a partly sectioned side elevational view of the arrangement of FIG. 1.

Referring now to the drawing in detail, and first to FIG. 1 thereof, it may be seen that the reference numeral 1 has been used therein to identify a testing arrangement of the present invention. The testing arrangement 1 includes an enclosure or housing 2 which bounds an anechoic chamber 3. The housing 2 can be made in its entirety of a material absorbent of free space electromagnetic radiation or, as shown, can be provided with a lining 4 which absorbs such radiation. This lining 4 could, however, also be provided at the outside of the housing 2 or even embedded in the material of the housing 2. The housing 2 is provided with an opening 5 that is aligned with the phased array antenna being tested (not shown in the drawing). As shown in FIGS. 1 and 2 of the drawing, the opening has dimensions A and B, such dimensions being accommodated to the phased array antenna and particularly to the effective aperture thereof.

During the testing operation, the phased array antenna in its transmitting mode emits radiation into and scans a predetermined sector of space within the anechoic chamber 3. This indicated in FIG. 1 of the drawing by angles $\alpha$ and $\beta$. The phased array antenna itself, as well as the electronic equipment which powers the same and thus causes it to emit electromagnetic radiation at least predominantly into the predetermined sector of space, are well known to those active in this field and hence need not be, nor will they be, discussed here in any detail. Suffice it to say that the phased array antenna includes a plurality of antenna element that are operative for emitting electromagnetic radiation in the radio frequency range with any desired polarization. The antenna elements may be selected or adaptively adjusted in response to polarization of received electromagnetic radiation as described hereinafter. The electromagnetic radiation wavefronts emitted by the individual antenna elements of the phased array antenna are still distinct in the so-called near field, but they eventually merge in the so-called far field into a well-developed electromagnetic radiation pattern. The anechoic chamber 3 bounded by the enclosure or housing 2 of the present invention is located in the near-field region of the phased array antenna.

To receive the electromagnetic radiation originating at the phased array antenna during the performance of the testing operation, there are provided two testing antennas 6 and 7 which are so situated as to be accommodated to the aforementioned sector of space and to the bandwidth of the phased array antenna. Basically, as illustrated, the testing antennas 6 and 7 are located at the boundaries of the predetermined sector of space. In accordance with an advantageous construction of the arrangement 1 of the present invention, the testing antennas 6 and 7 are constructed as so-called horn antennas. Such horn antennas are also known to those active in this field so that they need not be discussed here in any great detail, except for mentioning that each of them includes two pairs of antenna elements which extend at an acute angle with respect to a centerline of the respective horn antenna, diverging from one another in direction toward the opening 5. The antenna pairs are arranged at right angles to one another and are independent from one another to permit detection of the polarizations of received electromagnetic waves while being used to receive such electromagnetic waves. The antennas also permit issuance of electromagnetic waves of any desired polarizations when used as electromagnetic wave emitters. The enclosure or housing 2 is shown to be provided with a partitioning or separating wall 8 which provides isolation between the testing antennas 6 and 7 and thus permits application of sophisticated ECM waveforms which require very high isolation between transmit and receive signals.

Respective electric leads 9 and 10 connect the testing antennas 6 and 7 with an input/output interface 11 comprised of an RF switching matrix. The interface 11 forwards electrical signals received from the testing antennas 6 and 7 and representative of the electromagnetic radiation received by the testing antennas 6 and 7 to an evaluating circuit 12 via either lead 13 or lead 24. The evaluating circuit 12 below provides at its outputs 14 evaluating signals which indicate the amplitudes of the electrical signals received from the testing antennas 6 and 7 and thus, ultimately, the instantaneous amplitudes and polarization of the electromagnetic radiation emitted by the phased antenna array into the anechoic chamber 3. On the other hand, to measure the receiving characteristics of antenna elements being tested, the testing antennas 6 and 7 are used as electromagnetic radiation emitters which transmits RF into the anechoic chamber 3 and toward the phased array antenna aligned with the opening 5. A control signal determinative of the amplitudes and polarizations of the electromagnetic radiations emitted by the testing antennas 6 and 7 into the anechoic chamber 3 and toward the phased array antenna being tested that is aligned with the opening 5 is supplied via a control input 15 to a control circuit 16. The control circuit 16 has an output lead or bus 17 which is connected to the input/output interface 11 and via the same and the leads 9 and 10 to the testing antennas 6 and 7.

Figure 3:
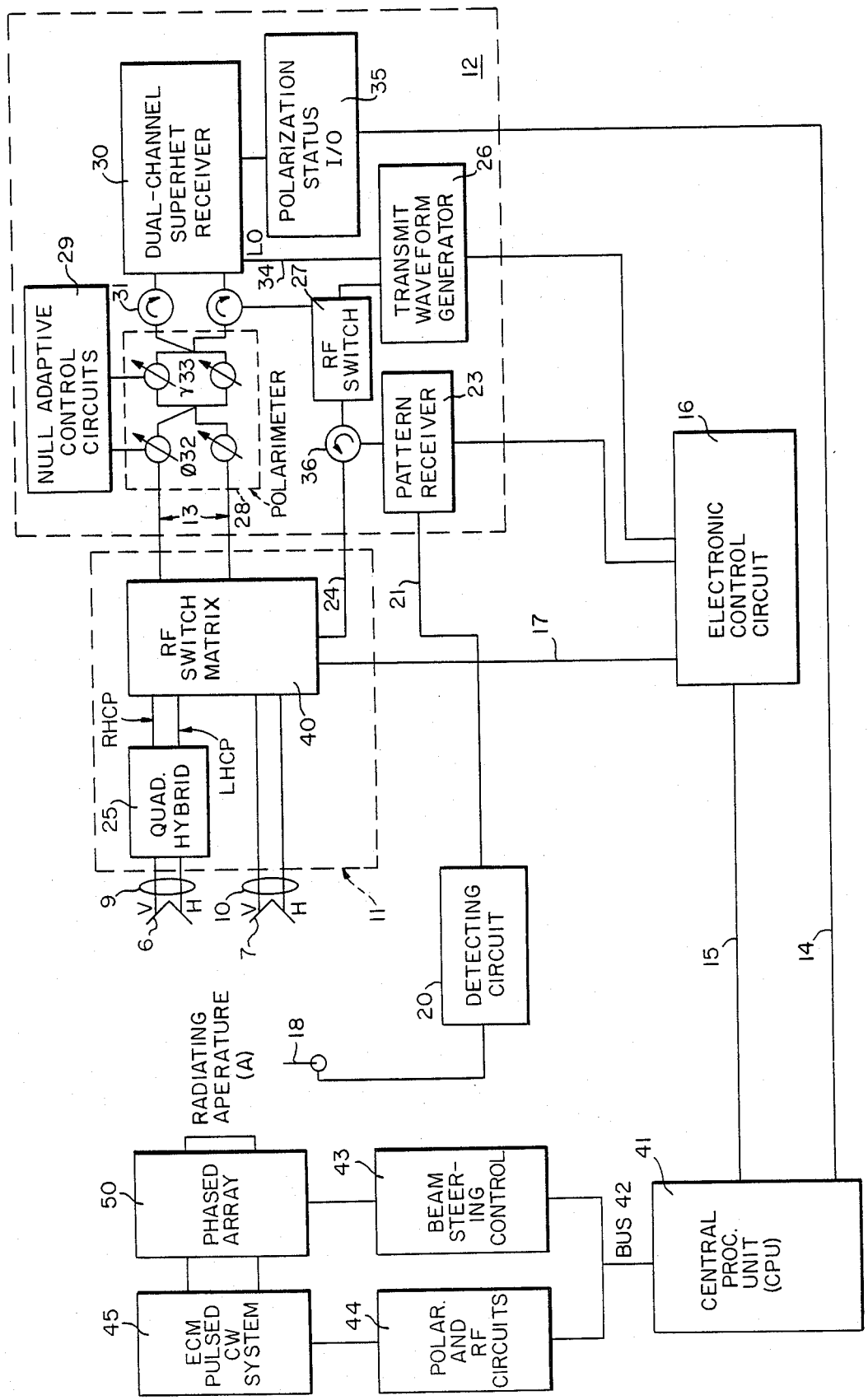
FIG. 3 is a more detailed block diagram of the arrangement shown in FIG. 1 as well as associated ancillary equipment.

The present invention with the stated Pulse/CW, bandwidth, pattern and polarization measurement capabilities becomes extremely important in evaluating complex ECM phased array based equipments when it is operated via a computer controlled Central Processing Unit (CPU) 41. The CPU is used merely to assist measuring and processing the output of the system. Attention is now directed to FIG. 3, which is an expansion of the arrangement shown in FIGS. 1 and 2 wherein the phased array being tested is identified by numeral 50. Techniques for measuring the polarization capabilities and antenna pattern of array 50 will now be discussed. The polarization measurement can be performed in two ways. The simplest method is to use antennas 6 and 7 in their dominant modes. Antenna 6 is dual-linearly polarized and is fed through a quadrature hybrid 25 that results in either right-hand (RHCP) or left-hand (LHCP) circular polarization; antenna 7 is Vertical (V) and Horizontal (H) linear. Appropriate selection with the RF Switch network 40 portion of interface 11 through line 17 provides one of four fixed polarizations to either stimulate the array with the waveform generator 26 or receive signals with the pattern receiver 23. Full polarization diversity, a novel feature of this invention, is obtained with the polarimeter 28 and its adaptive networks. The polarimeter is a dual-channel system connecting through the RF Switch Matrix to either antenna 6 or 7, simultaneously to both antenna ports (RHCP and LHCP in 6 or V in H in 7) by use of transmission lines 13. The polarimeter 28 is an RF amplitude and phase control circuit which provides the appropriate excitation of antennas 6 and 7 to achieve any desired polarization within the regimen of the invention. On receive, adjustment of the angle of phase by the phase shifters 32 provides phase control of the wavefront and angle phase shifters 33 provides amplitude control. The signal passes through circulators 31 to a dual-channel superheterodyne receiver 30 which employs null seeking circuits. An electronic loop is formed between shifter 32 and shifter 33 via the null adaptive control circuits 29 and adjustments of phase and amplitude are made until the null conditions are satisfied. By this means a polarization selectivity of at least 40 dB is achieved over a wide bandwidth. The final polarization state is passed to the CPU 41 via the status interface 35 for further evaluation of the phased array as required. The electronic control 16 reciprocity permits the use of the entire network either as a receiving or transmitting subsystem at the discretion of the CPU 41.

Pattern measurement capabilities which also encompass the direction finding (DF) processing by the array are provided with antennas 6 and 7 leading through the RF switch matrix 40 via line 24 and circulator 36 to the pattern receiver 23. State-of-the-art for conventional testing arrangements on aircraft (e.g. U.S. Pat. No. 3,199,107) employ measurement of static points in space and these embodiments yield only limited information on the antenna array. In the present invention the CPU 41 controls the transmission of antenna 50 via a bus 42 to beam steering controls 43 and the polarization and RF modulation circuit 44 which is fed to the antenna 50 via the ECM system 45 that may be pulsed or continuous wave CW). The use of two discrete test points (6 and 7) within the RF enclosure 3, provides not only array scanning capabilities, but can also inject the frequency behavior of scanned beams into the measurement to obtain an accurate, continuous radiation pattern of the array. This arrangement can thereby be used as a go/no-go criterion for the equipment or, in a troubleshooting mode, can be used to pinpoint the actual source of anomaly within the phased array network.

To be able to calibrate the arrangement 1, there is provided a calibrating antenna 18 which is arranged in the vicinity of the opening 5 and is operative for receiving the electromagnetic radiation emitted by the testing antennas 6 and 7 and issuing electrical signals representative of the received electromagnetic radiation. These signals are then supplied through a lead 19 which is shown to be embedded in the material of the housing 2 to a detecting circuit 20 of a known construction which issues correction signals that are supplied either to the evaluating circuit 12 as shown in solid lines by a lead 21, or to the control circuit 16 as shown by a broken-line lead 22, or to both. Such correction signals are then used by the respective circuits within 12 and/or 16 for correcting the output signals appearing at the outputs 14 and/or 17 thereof for the idiosyncrasies of the particular testing operation or configuration discussed hereinbefore.

FIGS. 1 and 2 also show the currently preferred dimensions of the housing or enclosure 2 as related to the corresponding dimensions of the opening 5. It may be seen that each of the height and the depth of the enclosure 2 has been chosen to amount to 3A, while the width of the housing 2 has been selected to be 2B. While the enclosure 2 has been shown to have a basically parallel piped configuration, it is to be understood that it could have any other shape that is convenient or dictated by the environment in which the arrangement 1 is to be used.

Thus, it may be seen that the invention provides a simplified means for evaluating the performance of an electronic system which employs a phased array antenna as its principal radiator into free space. The device of the present invention is a self-contained, self-calibrating enclosure, commonly referred to as a test coupler or a test hat, to be used with equipments installed on platforms or attachments thereto, without perturbing the installation or the performance of the system. This device can also support maintenance facilities for troubleshooting and repairing faulty phased array equipments.

It will be appreciated that, even though the electromagnetic radiation pattern is not yet fully developed in the near-field region in which the arrangement 1 of the present invention operates, there is a definite relationship between the near-field and the far-field radiation pattern. Thus, it is possible and contemplated by the present invention to determine the relationships between the near-field and far-field radiation patterns not only for the situation where the phased antenna array operates in the desired manner, but also for such situations where faults of different kinds are encountered in the performance of such phased array antenna arrangement, for instance, by deliberately introducing known faults into the radiation pattern of the phased array antenna arrangement. Such relationships can then be stored either in the evaluating circuit 12 or in the CPU 41 arranged downstream of the output 14, and can be used to indicate not only the occurrence of a fault in the performance of the phased array antenna arrangement, but also the kind and/or location of such fault.

While I have described above the principles of my invention in connection with specific apparatus, it is to be clearly understood that this description is made only by way of example and not as a limitation to the scope of my invention as set forth in the objects thereof and in the accompanying claims.

I claim:

1. An arrangement for testing the performance of an electronic system employing a phased array antenna for electromagnetic radiation scanning of a sector in space comprising:

a housing for bounding an anechoic chamber having an opening that is in registry with the phased array antenna during the performance of a testing operation;

at least two testing antennas disposed in said chamber opposite said opening and within the near field of the phased array antenna, said testing antennas being located at the outer boundaries of the sector in space being scanned, and being operative for receiving and transmitting electromagnetic radiation transmitted and received respectively by the phased array antenna through said chamber during the testing operation;

circuit means connected to said testing antennas for converting electromagnetic radiation received by said testing antennas into corresponding electrical signals;

means connected to said circuit means for evaluating said electrical signals;

polarimeter means connected to said testing antennas for producing a range of signals to at least one of said testing antennas to enable said testing antenna to emit electromagnetic radiation with a selectable polarization into said chamber and toward the phased array antenna; and a separating wall located opposite said opening and extending into said chamber from said housing, said wall separating said two testing antennas in order to provide isolation between signals transmitted from and received by said testing antennas.

2. The arrangement as defined in claim 1, wherein each of said testing antennas is constructed as a horn antenna.

3. The arrangement as defined in claim 1, wherein said evaluating means includes means for determining the amplitudes of said electrical signals.

4. The arrangement as defined in claim 1, wherein said evaluating means includes means for determining the polarization state of the received electro-magnetic radiation.

5. The arrangement as defined in claim 1, and further comprising a calibration antenna located in said chamber adjacent said opening and at a spacing from one of said testing antennas and operative for receiving the electromagnetic radiation by the latter, and means joined to said calibration antenna and said evaluating means for detecting the electromagnetic radiation reaching said calibration antenna during the operation of said one testing antenna and for utilizing the detected value for calibrating said evaluating means.

6. The arrangement as defined in claim 1, wherein said housing includes at least a layer of an electromagnetic radiation absorbing material substantially completely surrounding said chamber except at said opening.

* * * * *